US010388490B1

(12) United States Patent
Margulis

(10) Patent No.: US 10,388,490 B1
(45) Date of Patent: Aug. 20, 2019

(54) DETECTION UNIT, SCANNING CHARGED PARTICLE BEAM DEVICE AND A METHOD

(71) Applicant: Applied Materials Israel Ltd., Rehovot (IL)

(72) Inventor: Pavel Margulis, Ashdod (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 15/921,304

(22) Filed: Mar. 14, 2018

(51) Int. Cl.
*H01J 37/26* (2006.01)
*H01J 37/28* (2006.01)
*H01J 37/244* (2006.01)

(52) U.S. Cl.
CPC ............ *H01J 37/244* (2013.01); *H01J 37/28* (2013.01); *H01J 2237/2441* (2013.01); *H01J 2237/2448* (2013.01)

(58) Field of Classification Search
CPC .. H01J 37/244; H01J 37/28; H01J 2237/2441; H01J 2237/2448
USPC .......................... 250/306, 307, 309, 310, 311
See application file for complete search history.

(56) References Cited

U.S. PATENT DOCUMENTS

| 8,723,884 | B2* | 5/2014 | Koziarz | G06T 11/40 345/619 |
| 9,035,249 | B1 | 5/2015 | Frosien et al. | |
| 2014/0267590 | A1* | 9/2014 | McClatchie | H04N 5/23238 348/36 |
| 2014/0355846 | A1* | 12/2014 | Lee | G06K 9/0004 382/124 |
| 2016/0166223 | A1* | 6/2016 | Besson | A61B 6/5205 378/9 |

* cited by examiner

*Primary Examiner* — Nicole M Ippolito
(74) *Attorney, Agent, or Firm* — Kilpatrick Townsend & Stockton LLP

(57) ABSTRACT

A sensing unit includes a first set of sensors that comprises a first set of active areas that are surrounded by a first set of first non-active areas and a second set of sensors that comprises a second set of active areas that are surrounded by a second set of non-active areas. The first set of sensors and the second set of sensors are positioned at different heights, the first set of active areas and the second set of active areas do not overlap, and the first set of non-active areas and the second set of non-active areas partially overlap.

14 Claims, 12 Drawing Sheets

Receiving multiple secondary charge particle beams by a detection unit. Different secondary charge particle beams are detected by different detectors of the detection unit. The different detectors may include a first set of sensors and a second set of sensors. The first set of sensors may include a first set of active areas that may be surrounded by a first set of first non-active areas. The second set of sensors may include a second set of active areas that may be surrounded by a second set of non-active areas. The first set of sensors and the second set of sensors may be positioned at different heights. The first set of active areas and the second set of active areas may not overlap. The first set of non-active areas and the second set of non-active areas may partially overlap. 610

Generating, by different detectors of the detection unit, detection signals that represent the different secondary charge particle beams. 620

DETECTION UNIT, SCANNING CHARGED PARTICLE BEAM DEVICE AND A METHOD

BACKGROUND OF THE INVENTION

Multi-beam scanning electron microscopes use multiple spaced apart primary electron beams to scan an object—or to scan a selected region of an object.

Detectors of limited angular coverage are used to detect charged particles that are deflected or reflected from the object. Charged particles that propagate outside the limited angular range are not detected by the detectors.

These is a growing need to provide more effective detectors.

SUMMARY OF THE INVENTION

In light of the above, a charged particle beam device and a method of imaging a specimen or wafer are provided. Further aspects, advantages, and features of the present invention are apparent from the dependent claims, the description, and the accompanying drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 12 illustrates an example of a method.

DESCRIPTION OF THE PREFERRED EMBODIMENTS

Figure 1:
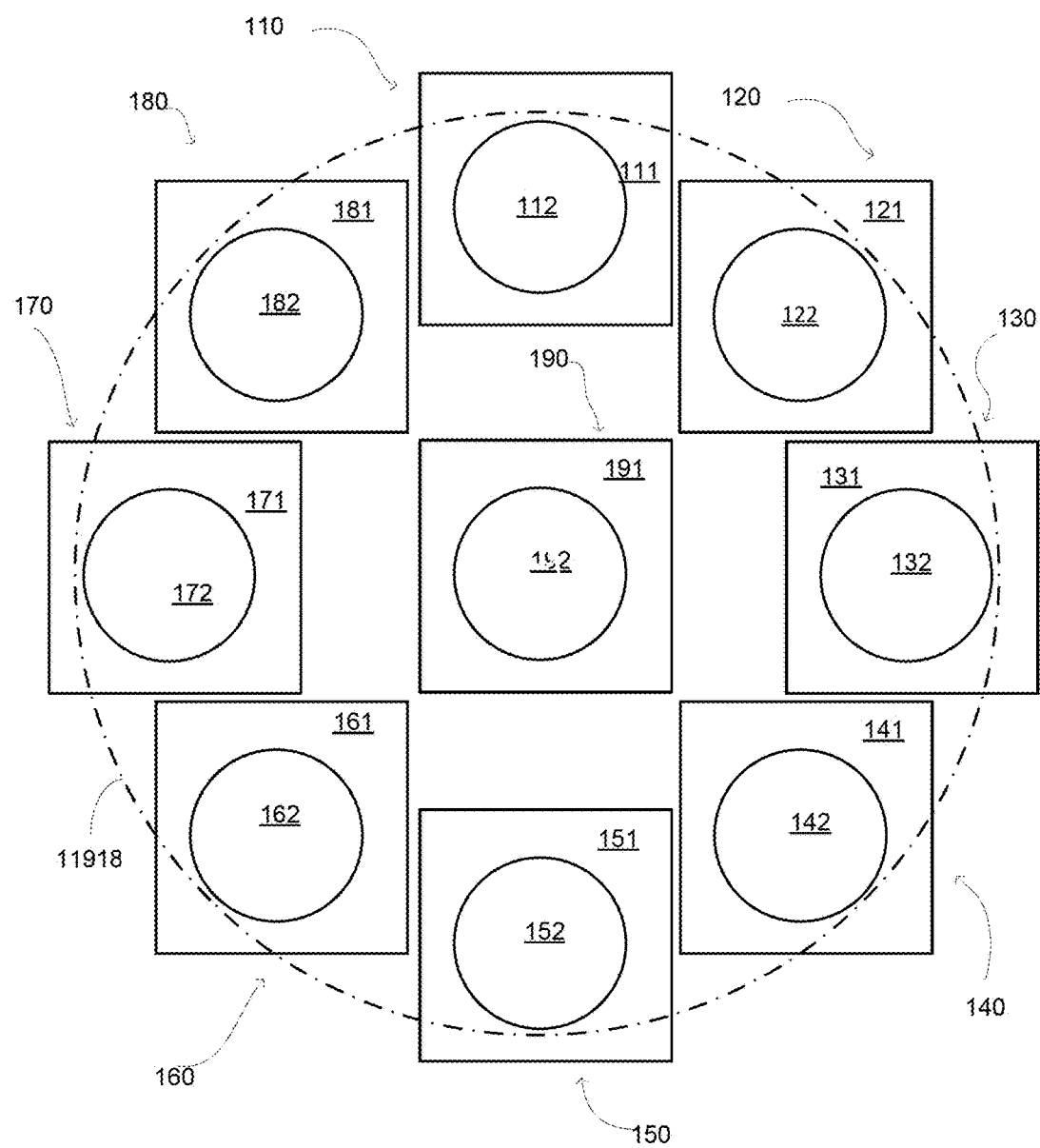
FIG. 1 illustrates an example of a sensing unit.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a computer program product that stores instructions that once executed result in the execution of the method.

Any reference in the specification to a system should be applied mutatis mutandis to a method that may be executed by the system should be applied mutatis mutandis to a computer program product that stores instructions that can be executed by the system.

Any reference in the specification to a computer program product should be applied mutatis mutandis to a method that may be executed when executing instructions stored in the computer program product and should be applied mutandis to a system that is configured to executing instructions stored in the computer program product.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

An "object" as referred to herein, includes, but is not limited to, semiconductor wafers, semiconductor workpieces, photolithographic masks and other workpieces such as memory disks and the like. Embodiments of the invention may be applied to any workpiece on which material is deposited or which is structured. An object includes a surface to be structured or on which layers are deposited, an edge, and typically a bevel. According to some embodiments, which can be combined with other embodiments described herein, the system and methods are configured for or are applied for electron beam inspection, for critical dimensioning applications and defect review applications.

The term "primary charged particle beam" is a charged particle beam that illuminates an object. The term "secondary charged particle beam" is a charged particle beam that is deflected or reflected from the object as a result of the illumination of the object by the primary charged particle beam. The charged particle may be an electron or an ion. The secondary charged particle beam may be a secondary electron beam, a backscattered electron beam or any other charged particle beam.

FIG. 1 illustrates an example of sensing unit 9 that includes nine sensors.

First sensor 110, second sensor 120, third sensor 130, fourth sensor 140, fifth sensor 150, sixth sensor 160, seventh sensor 170 and eighth sensor 180 form a circular array that surrounds ninth sensor 90.

First sensor 110 includes first active area 112 that is surrounded by first non-active area 111.

Second sensor 20 includes second active area 122 that is surrounded by second non-active area 121.

Third sensor 130 includes third active area 132 that is surrounded by third non-active area 131.

Fourth sensor 140 includes fourth active area 142 that is surrounded by fourth non-active area 141.

Fifth sensor 150 includes fifth active area 152 that is surrounded by fifth non-active area 51.

Sixth sensor 160 includes sixth active area 162 that is surrounded by sixth non-active area 161.

Seventh sensor 170 includes seventh active area 172 that is surrounded by seventh non-active area 171.

Eighth sensor 180 includes eighth active area 182 that is surrounded by eighth non-active area 181.

Ninth sensor 190 includes ninth active area 192 that is surrounded by ninth non-active area 191.

First sensor 110, second sensor 120, third sensor 130, fourth sensor 140, fifth sensor 150, sixth sensor 160, seventh sensor 170 and eighth sensor 180 do not overlap.

First active area 112, second active area 122, third active area 132, fourth active area 142, fifth active area 152, sixth active area 162, seventh active area 172 and eighth active area 182 are confined within first imaginary circle 198.

The lack of overlap introduced a significant distance between the center of sensing unit 9 and each active areas of the first sensors till the eighth sensor. This significant distance reduces the angular coverage of first sensor 110, second sensor 120, third sensor 130, fourth sensor 140, fifth sensor 150, sixth sensor 160, seventh sensor 170 and eighth sensor 180

Figure 2:
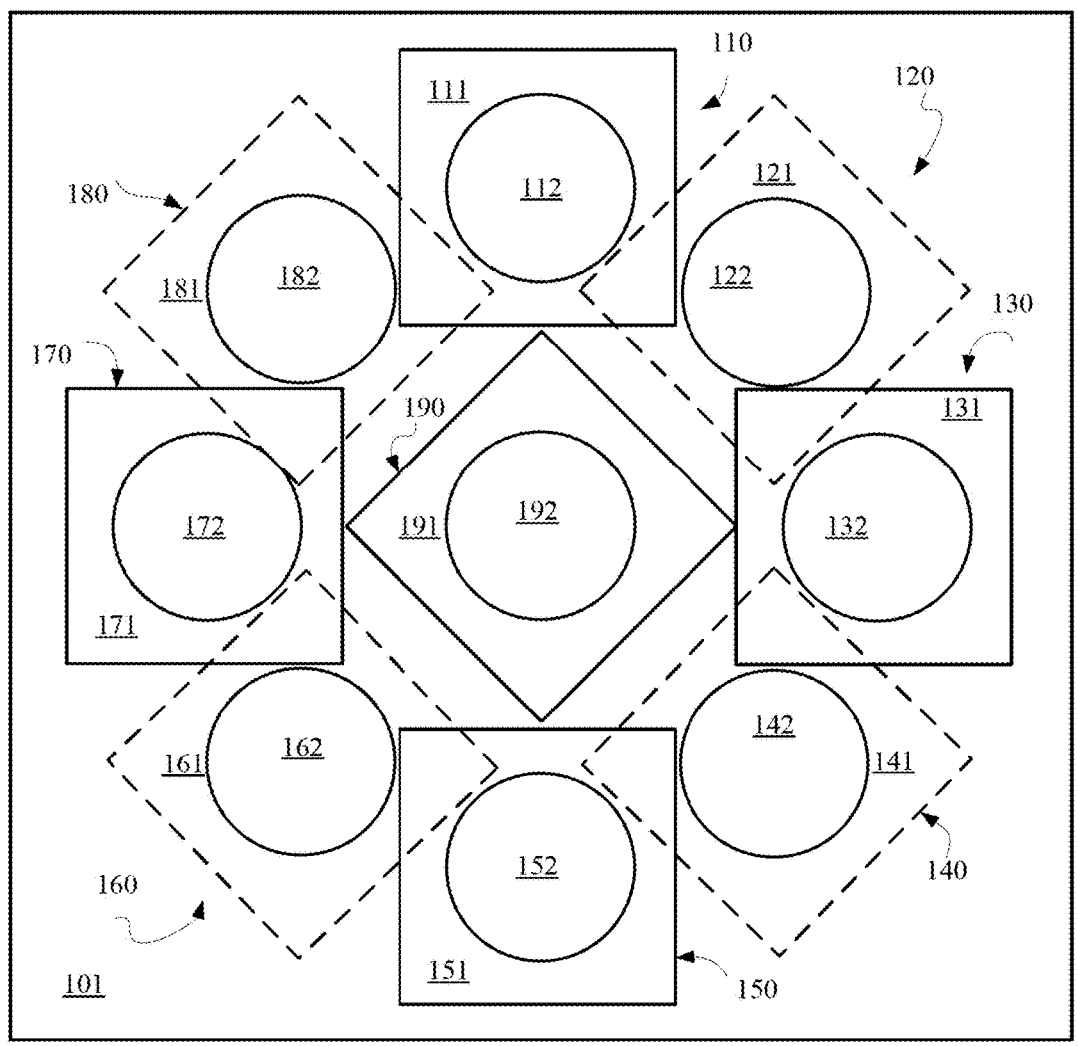
FIG. 2 illustrates an example of a sensing unit.

FIG. 2 illustrates an example of sensing unit 100 that includes nine sensors.

Sensing unit 100 includes a first set of sensors and a second set of sensors.

The first set of sensors includes first sensor 110, third sensor 130, fifth sensor 150, and seventh sensor 170.

The second set of sensors includes second sensor 120, fourth sensor 140, sixth sensor 160, and eighth sensor 180

First active area 112, second active area 122, third active area 132, fourth active area 142, fifth active area 152, sixth active area 162, seventh active area 172 and eighth active area 182 do not overlap.

First non-active area 111, second non-active area 121, third non-active area 131, fourth non-active area 141, fifth non-active area 151, sixth non-active area 161, seventh non-active area 171 and eighth non-active area 181 partially overlap.

Each non-active area that belongs to a sensor of the first set of sensors partially overlaps two non-active areas that belong to two sensors of the second set of sensors.

Each non-active area that belongs to a sensor of the second set of sensors partially overlaps two non-active areas that belong to two sensors of the first set of sensors.

Figure 3:
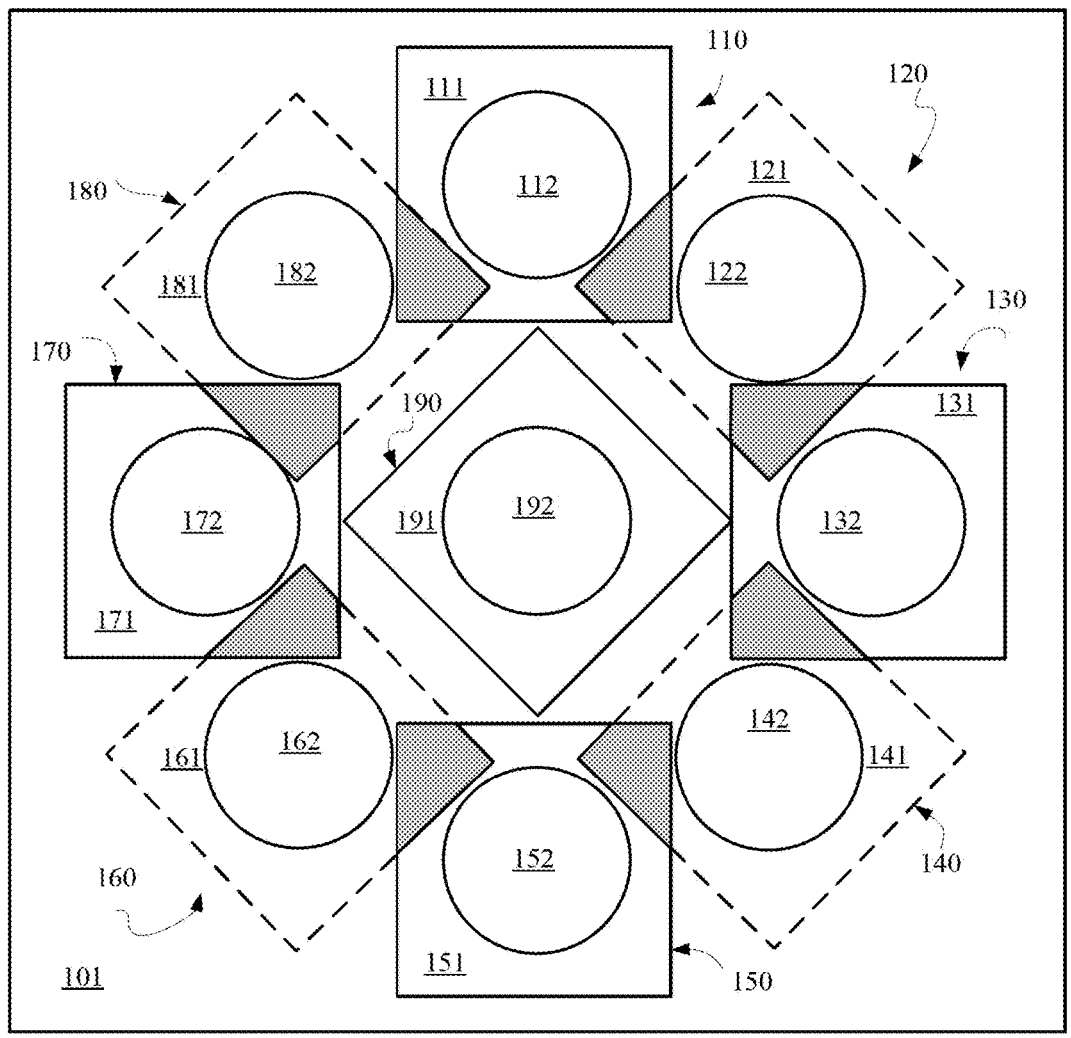
FIG. 3 illustrates an example of a sensing unit.

In FIG. 3 overlap areas between the non-active regions are colored in gray.

Figure 4:
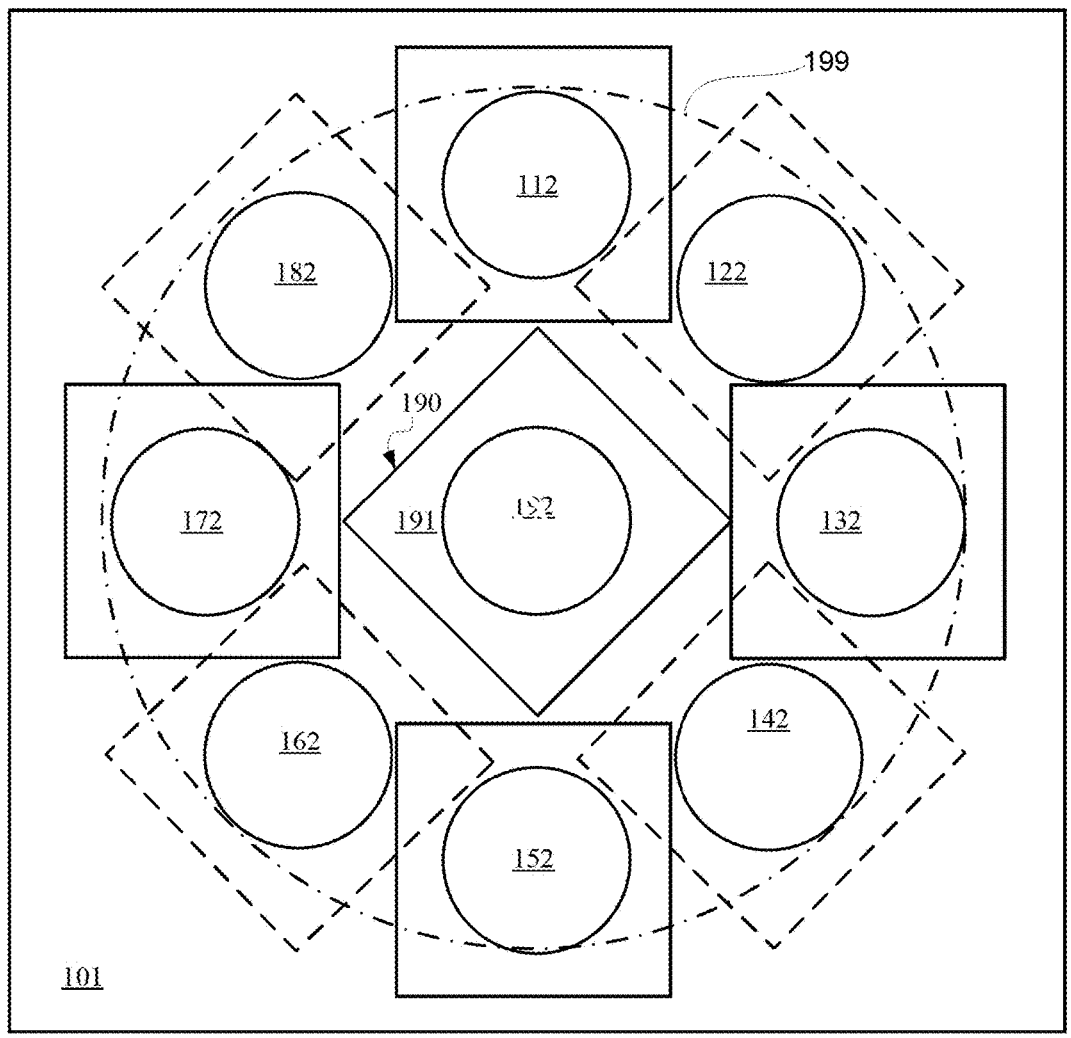
FIG. 4 illustrates an example of a sensing unit.

FIG. 4 illustrates that first active area 112, second active area 122, third active area 132, fourth active area 142, fifth active area 152, sixth active area 162, seventh active area 172 and eighth active area 182 are confined within second imaginary circle 199.

Second imaginary circle 199 is much smaller than first imaginary circle 198. Accordingly—in sensing unit 100 the angular coverage of the sensors significantly exceeds the angular coverage of the sensors of sensing unit 9 of FIG. 1. Furthermore—the sensing unit 100 is more compact than sensing unit 9 of FIG. 1.

Sensors of the first set of sensors are located at different height than sensors of the second set of sensors. For example—the sensors of the first set of sensors are positioned at a first side of support element 101 while the sensors of the second set of sensors are positioned at a second side of support element 101.

Support element 101 exposes the active areas of sensors the first set of sensors while concealing the non-active areas of the sensors of the second set of sensors.

The arrangement of the sensors of the first set of sensors and of the second set of is illustrated in FIGS. 1-4 by the dashed lines that represent the non-active areas of the sensors of the second set of sensors.

Figure 5:
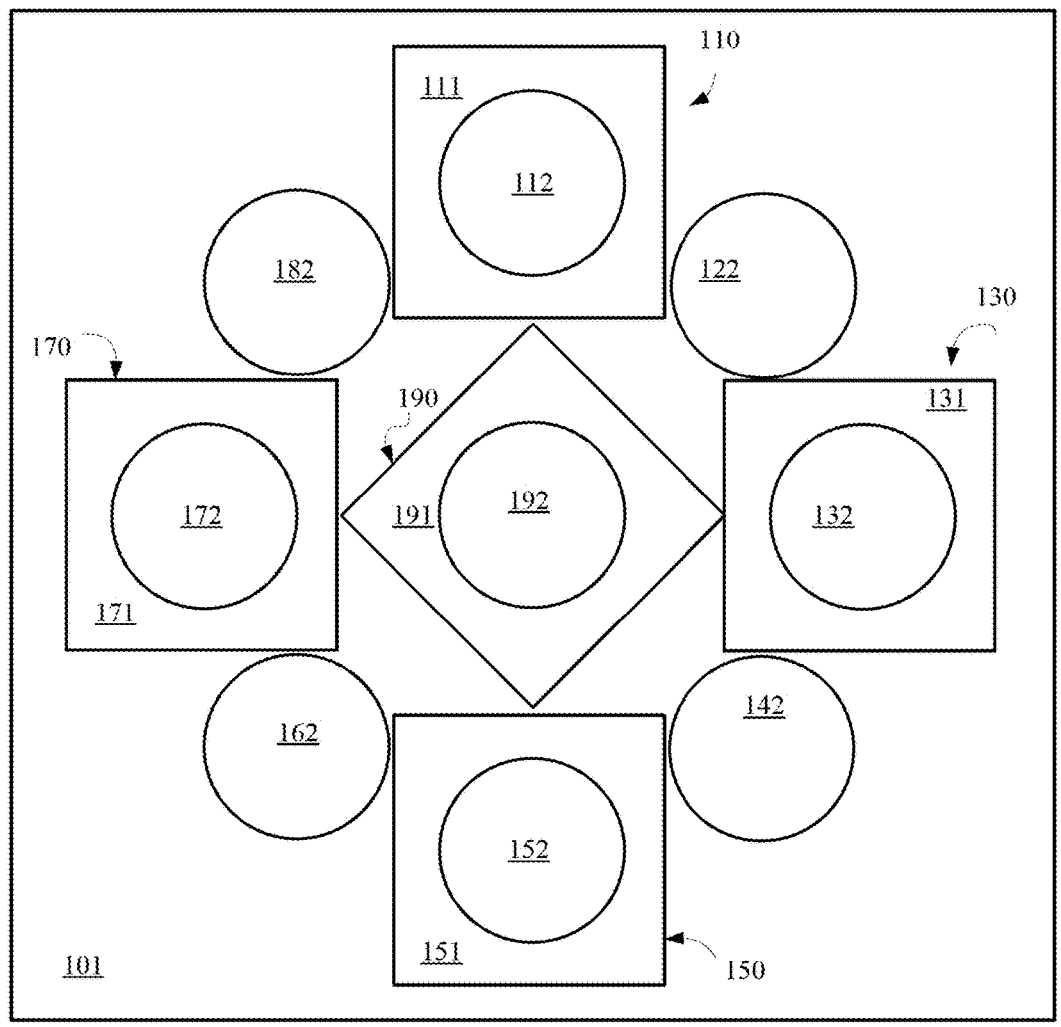
FIG. 5 illustrates an example of a sensing unit.

FIG. 5 is a top view of sensing unit 100. The top view illustrates the active areas of all nine sensors and does not illustrate the concealed non-active areas of the seconds et of sensors.

Figure 6:
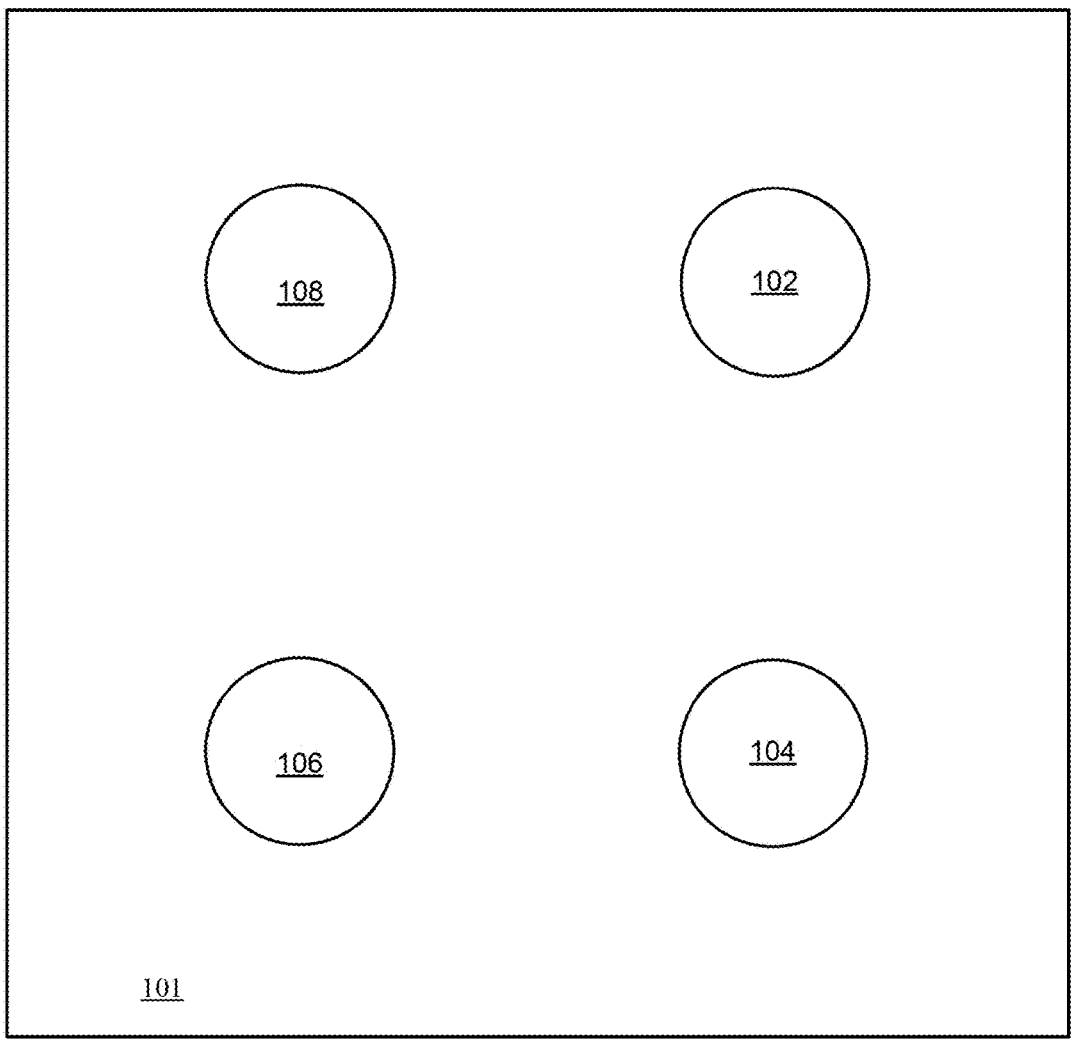
FIG. 6 illustrates an example of a support element of a sensing unit.

FIG. 6 illustrates support element 101 that includes (a) first aperture 102 for exposing the non-active region 122 of second sensor, (b) second aperture 104 for exposing the non-active region 142 of fourth sensor, (c) third aperture 106 for exposing the non-active region 162 of sixth sensor, and (d) fourth aperture 108 for exposing the non-active region 182 of ninth sensor.

Figure 7:
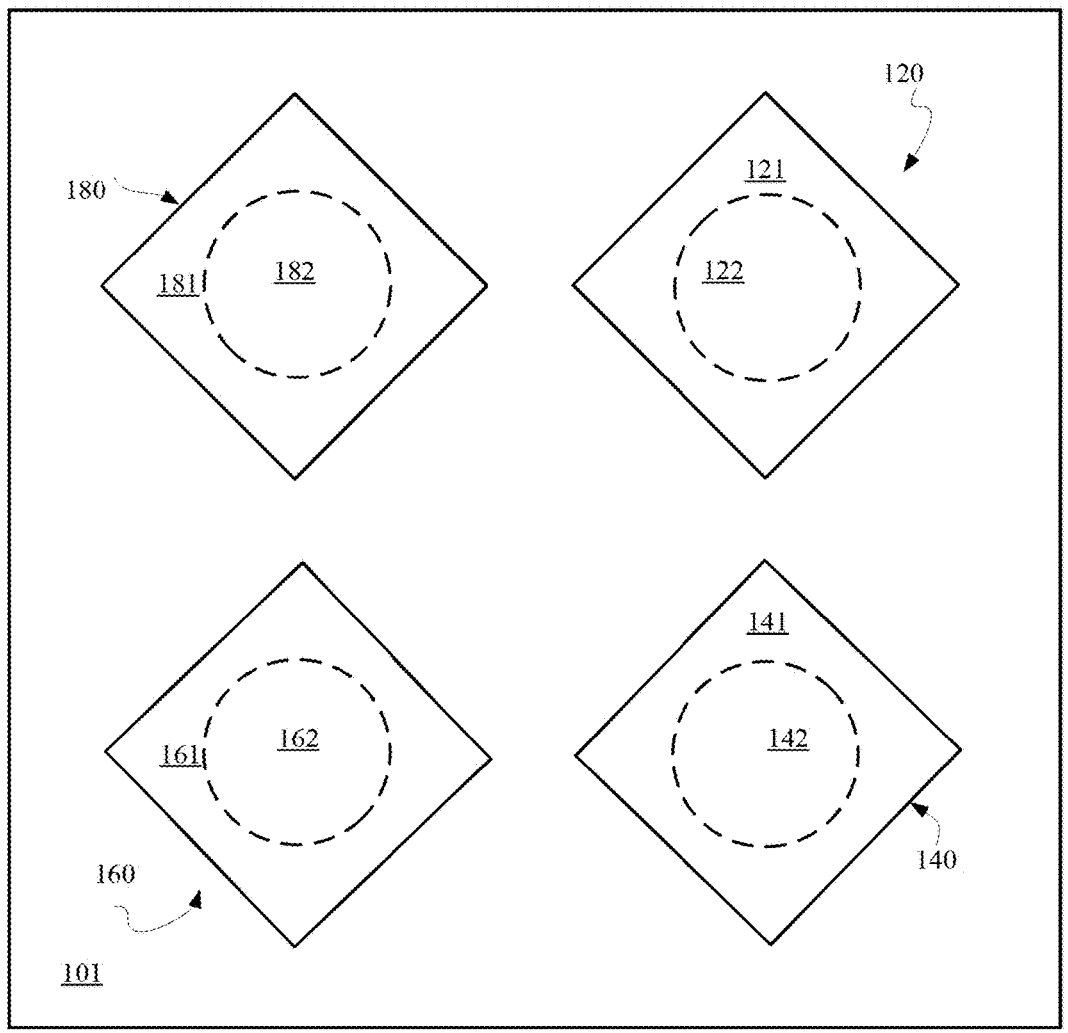
FIG. 7 illustrates an example of a sensing unit.

FIG. 7 is a bottom view of sensing unit 100. The bottom view illustrates second non-active area 121, fourth non-active area 141, sixth non-active area 161 and eight non-active area 181. Second active area 122, fourth active area 142, sixth active area 162 and eight active area 182 face the top of of the sensing unit and are illustrated by dashed lines.

Each sensor may be coupled to conductors for providing bias signals and for reading the sensor (receiving detection signals). For example—a bias voltage may be applied between the active area and the non-active area while the detection signal may be a current that is read from the active area.

The conductors may be positioned in any location.

Figure 8:
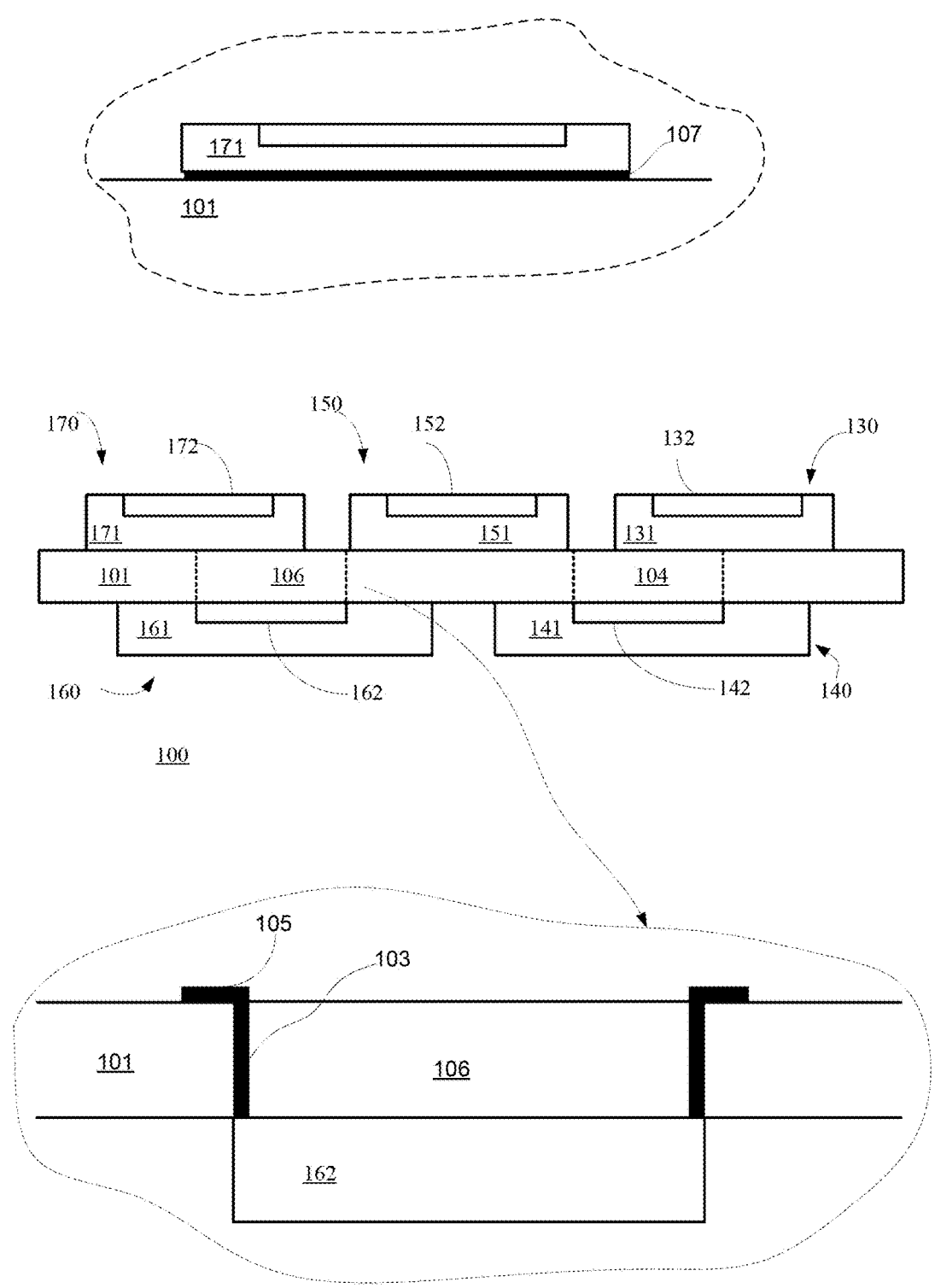
FIG. 8 illustrates an example of a sensing unit.

FIG. 8 illustrates that the support element 101 includes apertures (such as second aperture 104 and third aperture 106) and that the active areas of sensors of the second set of sensors are coupled to intermediate conductors that are electrically coupled to first side conductors that are located on the first side of the support element.

FIG. 8 is a side view of sensing unit and illustrates third sensor 130, fourth sensor 140, fifth sensor 150, sixth sensor 160 and seventh sensor 170. Other sensors of the sensing unit are not shown.

Third aperture 106 is partially coated by intermediate conductor 103 that are electrically coupled to third active conductor 105 that is positioned on the first side of the support element 101.

FIG. 8 also illustrates that the non-active areas of sensors of the first set of sensors may be positioned on first side conductors. For example—seventh non-active area 171 is positioned on seventh non-active conductor 107.

Figure 9:
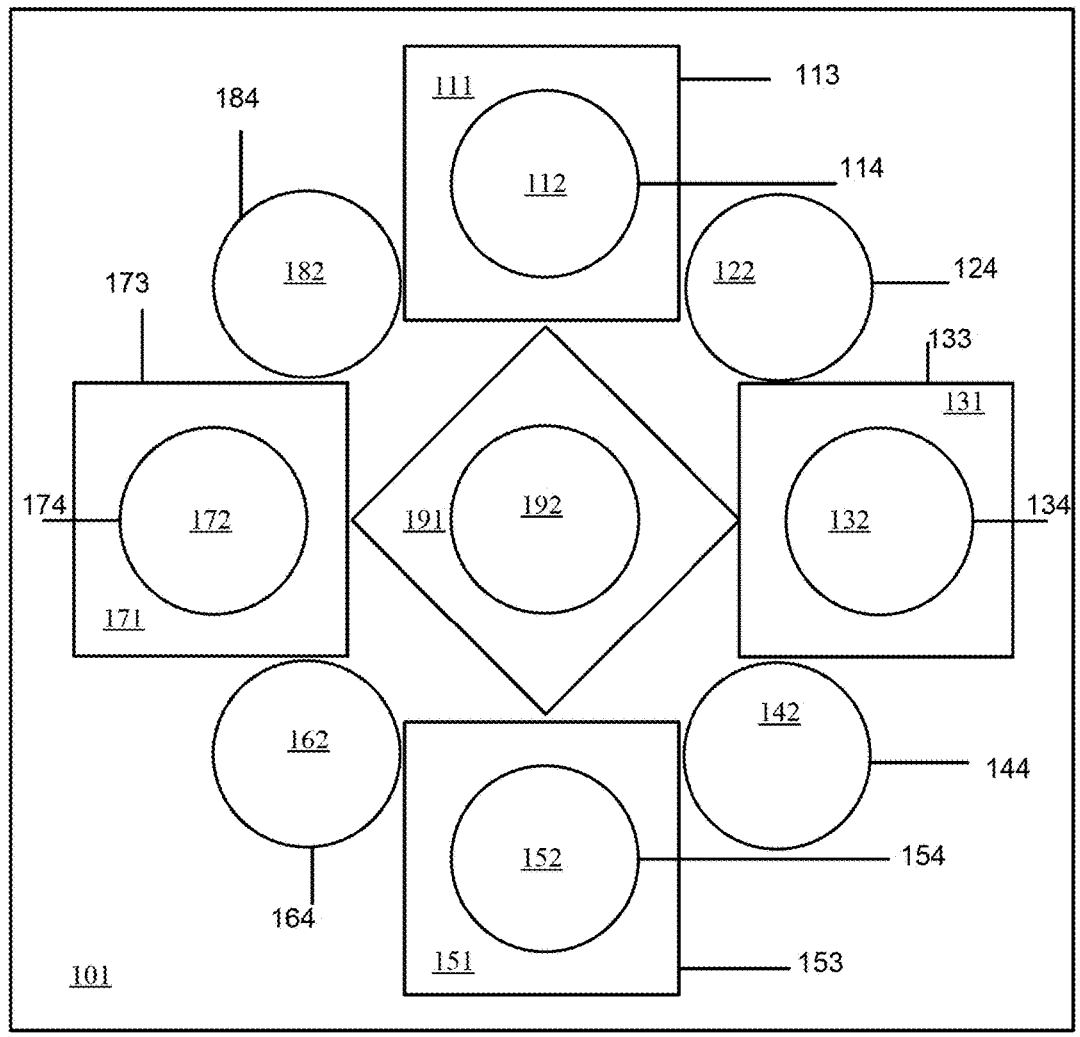
FIG. 9 illustrates an example of a sensing unit.

FIG. 9 illustrates various first side conductors that are coupled to various active areas and non-active areas.

First active area 112 is coupled to first active conductor 114, second active area 122 is coupled to second active conductor 124, third active area 132 is coupled to third active conductor 134, fourth active area 142 is coupled to fourth active conductor 144, fifth active area 152 is coupled to fifth active conductor 154, sixth active area 162 is coupled to sixth active conductor 164, seventh active area 172 is coupled to seventh active conductor 174, and eighth active area 182 is coupled to eighth active conductor 184.

First non-active area 111 is coupled to first non-active conductor 113, second non-active area is coupled to second non-active conductor (not shown), third non-active area 131 is coupled to third non-active conductor 133, fourth non-active area is coupled to fourth non-active conductor (not shown), fifth non-active area 151 is coupled to fifth non-active conductor 153, sixth non-active area is coupled to sixth non-active conductor (not shown), seventh non-active area 171 is coupled to seventh non-active conductor 173, and eighth non-active area is coupled to eighth non-active conductor (not shown).

Although FIGS. 1-9 illustrate nine sensors—the number of sensors may differ from nine. For example—the sensing unit may not include the ninth sensor. Yet for another example—the number of sensors may exceed two.

Figure 10:
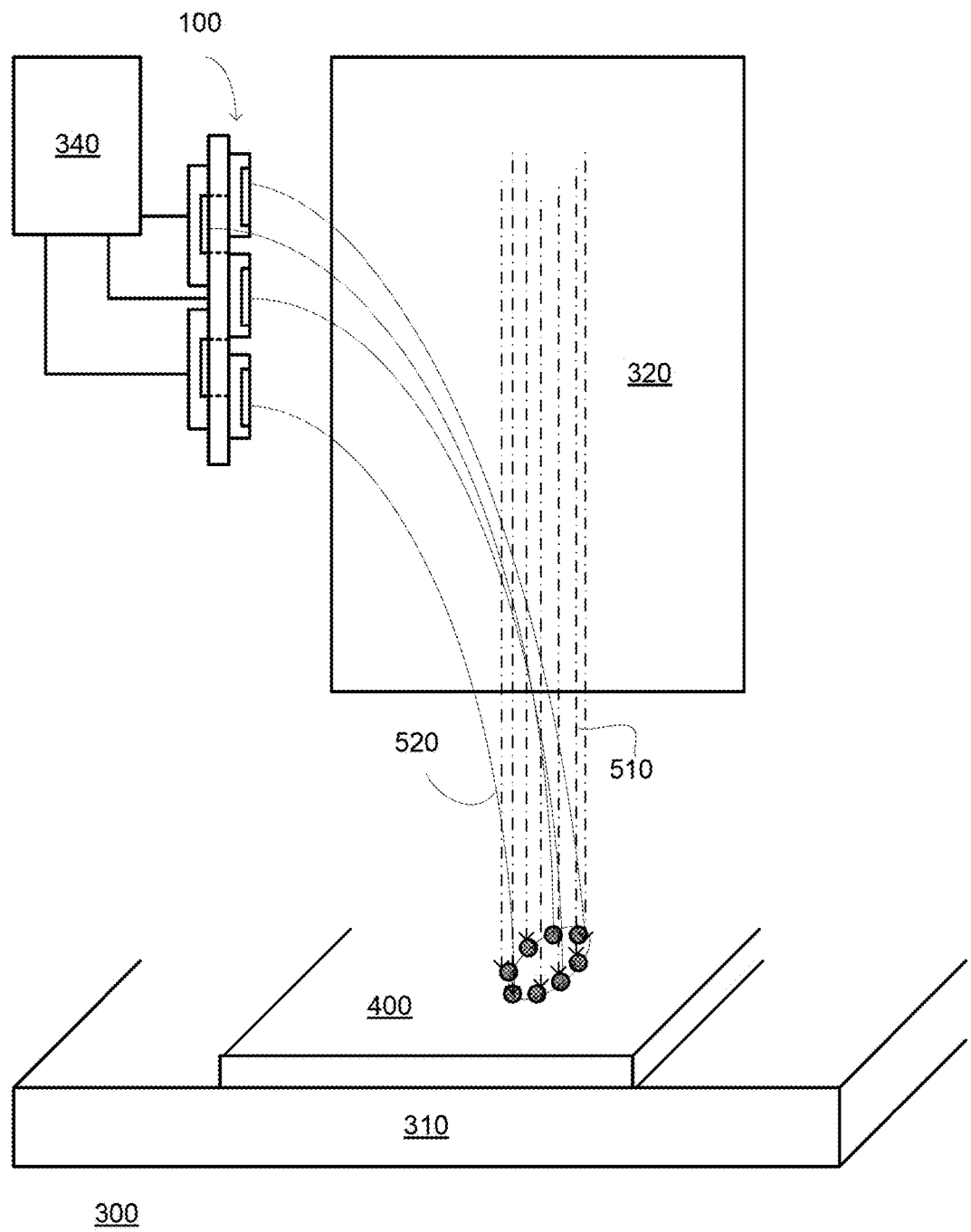
FIG. 10 illustrates an example of a system and an object.

FIG. 10 illustrates object 400 and scanning charged particle beam device 300.

Scanning charged particle beam device 300 includes sensing unit 100 and charged particle optics 320 that is configured to (a) illuminate object 400 with primary charged particle beams 510, (b) direct different secondary charged particle beams 520 from the object 400 towards different sensors of the sensing unit 100. The different sensors belong to the first set of sensors and the second set of sensors.

Figure 11:
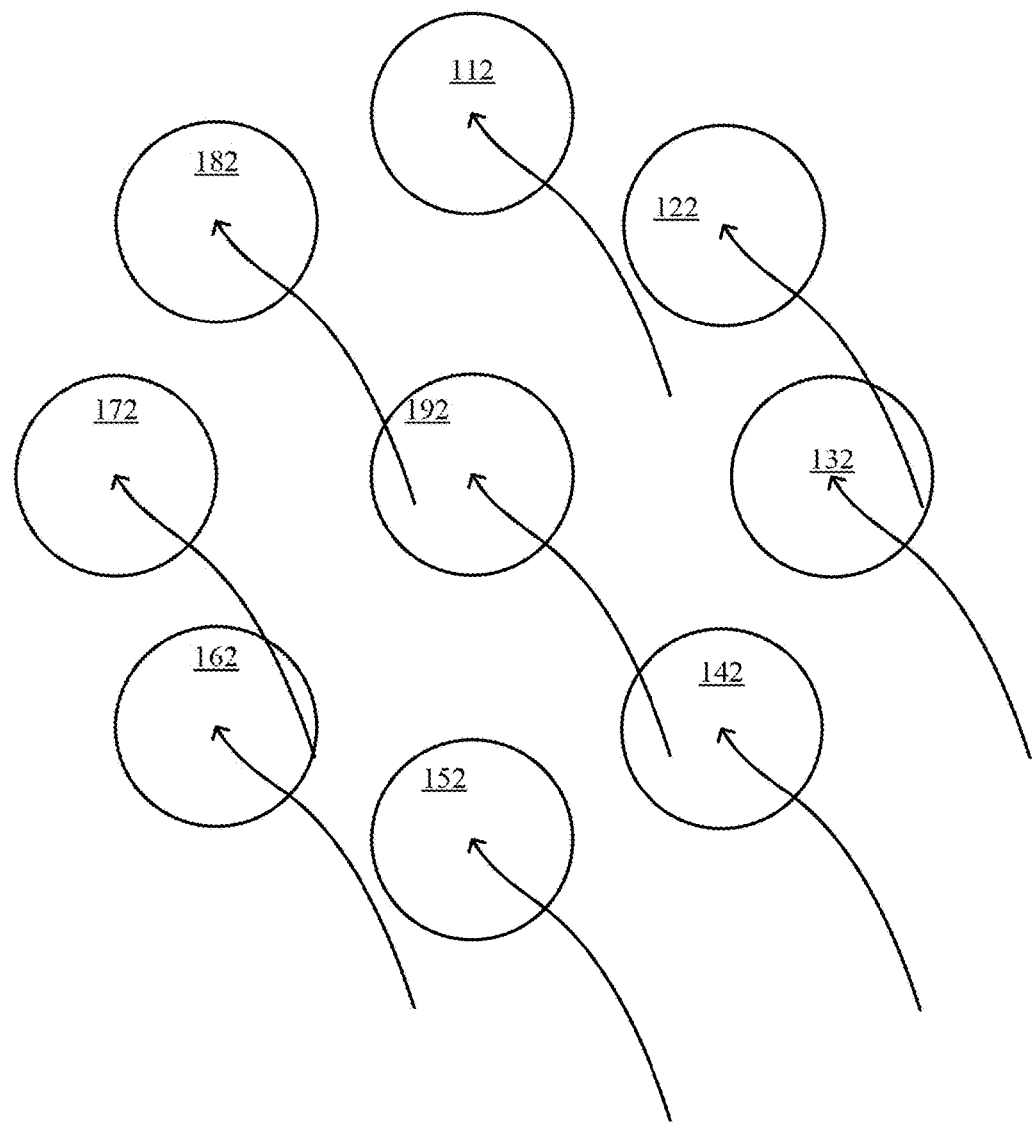
FIG. 11 illustrates an example of secondary charged particle beams and a sensing unit.

Each sensor of the sensing unit 100 may receive a single secondary charged particle beam. This is illustrated in FIG. 11 in which the secondary charged particle beams are represented by arrows.

The charge particle optics may generate the primary charged particle beams or may receive the primary charged particle beams, may include electron optics lenses, deflectors, and the like. A non-limiting example of such charge particle optics is illustrated in U.S. Pat. No. 9,035,249 titled "Multi-beam system for high throughput EBI". Sensing unit 100 may replace detector assembly 9 of FIG. 1A of U.S. Pat. No. 9,035,249.

FIG. 10 also illustrates (a) mechanical stage 310 for moving the object 400 in relation to the charged particle optics 320, and (b) hardware processor 340 for receiving the detection signals from sensing unit 100 and generate information (for example—an image) that represents the detection signals.

FIG. 12 illustrates an example of method 600.

Method 600 is for sensing multiple secondary charge particle beams.

Method 600 may start by step 610 of receiving multiple secondary charge particle beams by a detection unit. Different secondary charge particle beams are detected by different detectors of the detection unit. The different detectors may include a first set of sensors and a second set of sensors. The first set of sensors may include a first set of active areas that may be surrounded by a first set of first non-active areas. The second set of sensors may include a second set of active areas that may be surrounded by a second set of non-active areas. The first set of sensors and the second set of sensors may be positioned at different heights. The first set of active areas and the second set of active areas may not overlap. The first set of non-active areas and the second set of non-active areas may partially overlap.

Step 610 may be followed by step 620 of generating, by different detectors of the detection unit, detection signals that represent the different secondary charge particle beams.

Steps 610 and 620 may be repeated while the object (or at least a part of the object) is scanned with the primary charged particle beams.

Method 600 may include processing the detection signals to provide information about the object. The processing may include generating an image of the object (or of the at least scanner region of the object), detecting suspected defects, detecting actual defects, reviewing suspected defects, measuring nanometric structures of the object, and the like.

Method 600 may include illuminating the object with primary charged particle beams.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the sensing unit and the system.

The phrase "may be X" indicates that condition X may be fulfilled. This phrase also suggests that condition X may not be fulfilled.

While the foregoing is directed to embodiments of the invention, other and further embodiments of the invention may be devised without departing from the basic scope thereof, and the scope thereof is determined by the claims that follow.

The invention claimed is:

1. A sensing unit, comprising:
a first set of sensors that comprises a first set of active areas that are surrounded by a first set of non-active areas;
a second set of sensors that comprises a second set of active areas that are surrounded by a second set of non-active areas;
wherein the first set of sensors and the second set of sensors are positioned at different heights;
wherein the first set of active areas and the second set of active areas do not overlap; and
wherein the first set of non-active areas and the second set of non-active areas partially overlap.

2. The sensing unit according to claim 1 further comprising an additional sensor that does not overlap any sensor of the first set of sensors and does not overlap any sensor of the second set of sensors.

3. The sensing unit according to claim 1 wherein each non-active area of the first set of non-active areas partially overlaps a pair of adjacent non-active areas of the second set of non-active areas.

4. The sensing unit according to claim 1 comprising a support element that is mechanically coupled to the first set of sensors and to the second set of sensors.

5. The sensing unit according to claim 4 wherein sensors of the first set of sensors are mechanically coupled to a first side of the support element and wherein sensors of the second set of sensors are mechanically coupled to another side of the support element.

6. The sensing unit according to claim 5 wherein the support element comprises apertures for exposing the second set of active areas while concealing the second set of non-active areas.

7. The sensing unit according to claim 6 comprising intermediate conductors that are least partially coat the apertures and electrically couple the second set of active areas to first side conductors that are located on the first side of the support element.

8. The sensing unit according to claim 4 wherein the support element is a plate.

9. The sensing unit according to claim 1 wherein the first set of sensors and the second set of sensors form a circular array of sensors.

10. The sensing unit according to claim 9 wherein the first set of active areas and the second set of active areas have a circular shape and have a same radius.

11. The sensing unit according to claim 10 wherein the first set of active areas and the second set of active areas are confined within a circular region that has a radius of that does not exceed three and a half times of the radius of an active area of the first set of active areas.

12. The sensing unit according to claim 1 wherein the first set of sensors are PIN diodes or avalanche photodiodes.

13. A scanning charged particle beam device, comprising:
a sensing unit that comprises a first set of sensors and a second set of sensors; and
charged particle optics that is configured to (a) illuminate an object with primary charged particle beams, (b) to direct different secondary charged particle beams from the object towards different sensors of the first set of sensors and the second set of sensors;
wherein the first set of sensors comprises a first set of active areas that are surrounded by a first set of non-active areas;
wherein the second set of sensors comprises a second set of active areas that are surrounded by a second set of non-active areas;
wherein the first set of sensors and the second set of sensors are positioned at different heights;
wherein the first set of active areas and the second set of active areas do not overlap;
wherein the first set of non-active areas and the second set of non-active areas partially overlap.

14. A method for sensing multiple secondary charge particle beams, the method comprising:
receiving multiple secondary charge particle beams by a detection unit;
wherein different secondary charge particle beams are detected by different detectors of the detection unit;
generating, by the different detectors of the detection unit, detection signals that represent the different secondary charge particle beams;
wherein the different detectors comprise a first set of sensors and a second set of sensors;
wherein the first set of sensors comprises a first set of active areas that are surrounded by a first set of non-active areas;
wherein the second set of sensors comprises a second set of active areas that are surrounded by a second set of non-active areas;
wherein the first set of sensors and the second set of sensors are positioned at different heights;

wherein the first set of active areas and the second set of active areas do not overlap; and wherein the first set of non-active areas and the second set of non-active areas partially overlap.

* * * * *